US006343031B1

United States Patent
Murata

(12) United States Patent
(10) Patent No.: US 6,343,031 B1
(45) Date of Patent: Jan. 29, 2002

(54) SEMICONDUCTOR MEMORY DEVICE

(75) Inventor: Nobukazu Murata, Tokyo (JP)

(73) Assignee: Oki Electric Industry Co., Ltd., Minato-ku (JP)

( * ) Notice: Subject to any disclaimer, the term of this patent is extended or adjusted under 35 U.S.C. 154(b) by 0 days.

(21) Appl. No.: 09/769,424

(22) Filed: Jan. 26, 2001

(30) Foreign Application Priority Data

Jul. 14, 2000 (JP) .......................................... 2000-213610

(51) Int. Cl.[7] .............................................. G11C 17/00
(52) U.S. Cl. .................. 365/104; 365/226; 365/185.18; 365/189.09
(58) Field of Search ...................... 365/104, 63, 185.18, 365/226, 189.09

(56) References Cited

U.S. PATENT DOCUMENTS 5,406,521 A * 4/1995 Hara ........................... 365/218
5,818,759 A * 10/1998 Kobayashi ............. 365/185.15
5,999,475 A * 12/1999 Futasuya et al. ............ 365/226
6,084,794 A * 7/2000 Lu et al. ...................... 365/104

FOREIGN PATENT DOCUMENTS

JP 2210694 8/1990

* cited by examiner

Primary Examiner—Huan Hoang
(74) Attorney, Agent, or Firm—Venable; Robert J Frank

(57) ABSTRACT

A semiconductor storage device of the present invention comprises a plurality of alternately arranged select lines and bit lines, a plurality of word lines arranged substantially orthogonal to the select lines and bit lines, a plurality of MOS transistors, having first electrodes connected to the select lines, second electrodes connected to the bit lines and control electrodes connected to the word lines, forming a plurality of memory cells, a first voltage supply circuit connected to the select lines for supplying a first voltage to the first electrodes, and a second voltage supply circuit connected to the bit lines and the select lines for supplying a second voltage, varying in compliance with variation in the first voltage, to the second electrodes.

12 Claims, 4 Drawing Sheets

SEMICONDUCTOR MEMORY DEVICE

BACKGROUND OF THE INVENTION

FIELD OF THE INVENTION

The present invention relates to a semiconductor memory circuit, and particularly to a data read circuit for a Read Only Memory (hereafter referred to as ROM).

This application is a counterpart application of Japanese application Ser. No. 213610/2000, filed Jul. 14, 2000, the subject matter of which is incorporated herein by reference.

DESCRIPTION OF THE RELATED ART

A plurality of memory cells constituting a memory cell array of a conventional ROM circuit are made using, for example, non-volatile MOS (Metal Oxide Semiconductor) transistors such as MOS transistors having a floating gate electrode. Drain electrodes of MOS transistors making up these plurality of memory cells are connected to select lines, while source electrodes are connected to bit lines. The select lines and the bit lines are arranged alternately, to form a plurality of column lines. Also, a control gate electrode (control gate) of each MOS transistor is connected to a plurality of word lines making up a row line.

Next, a data write operation for a memory cell of a ROM circuit such as that described will now be described. Of the above described column lines, each select line connected to a drain electrode of a MOS transistor is connected to a drain power supply circuit through a select line selection transistor. This drain power supply circuit supplies a voltage of, for example, 4.5 V to a selected select line when data is written to a memory cell. On the other hand, each of the bit lines connected to a source electrode of a MOS transistor is connected to a data write circuit through a bit line selection transistor. This data write circuit supplies a ground potential to a selected bit line when data of "0" is written to a memory cell (electrons are injected into the floating gate of the MOS transistor constituting the memory cell), and supplies a voltage of, for example, 3V to the selected bit line when data of "1" is written to the memory cell (electrons are not injected into the floating gate electrode of the MOS transistor constituting the memory cell). During the data write operation, a voltage of, for example about 8 V is applied to the word line connected to the memory cell subject to data write, and the select line selection transistor and bit line selection transistor connected to the same memory cell are put into a conducting state. When a voltage of 4.5 V is applied between the drain electrode and source electrode of a MOS transistor constituting the memory cell, data of "0" is written into the memory cell, while when a voltage less than 1.5 V is applied, data of "1" is written to the memory cell.

After that, for the data cell to which data has been written, a verify operation is performed to confirm that the desired data has been written, in which the potential of the select line and the word line are set to ground potential by the drain electrode power supply and the data write circuit as the potential of the word line is lowered. By carrying out this kind of 1:1 operation, for example, it is confirmed whether or not an erroneous data write has occurred to the memory cell due to residual charge on the bit line.

As described above, in a conventional ROM circuit, for example, when an operation to write data of "1" into the memory cell is started or completed, a voltage applied to the source electrode and drain electrode of the MOS transistor constituting the memory cell is raised or lowered by a separate circuit, namely the drain electrode power supply and the write circuit.

However, in the case of such a data "1" write operation, there is a possibility of erroneous data being written to the memory cell due to either the voltage applied to the source electrode being higher than the voltage applied to the drain electrode when the voltage is raised, or the difference in voltage between the voltage applied to the source electrode and the voltage applied to the drain electrode being too large (for example a difference greater than 1.5 V) when the voltage is lowered.

To suppress such erroneous data writes, there has been considered a method where, in the case of commencing a data "1" write operation, the supply of voltage to the word line is only commenced after the voltage applied to the drain electrode and source electrode of the MOS transistor constituting the memory cell has become sufficiently stable, or after the voltage applied to the drain electrode has become higher than the voltage applied to the source electrode. On the other hand, in the case of completing a data "1" write operation, there has been considered a method of lowering the potential of the word line before a difference between the voltage applied to the drain electrode and the source applied to the electrode becomes large.

However, when such a data "1" operation is commenced, if there is a delay in commencing supply of voltage to the word line the time required to write data "1" to the memory cell is a increased. Also, when completing the data "1" write operation, if the lowering of the voltage to the word line is early the data write to the memory cell is insufficiently carried out, with the result that there is a possibility of an erroneous data write occurring.

Accordingly, in the ROM circuit it is preferable on the one hand to prevent any increase in the time required to write data of "1" to the memory cell as described above, and on the other hand to effectively prevent the possibility of write errors when commencing or completing data "1" write to the memory cell.

SUMMARY OF THE INVENTION

An object of the present invention is to provide a semiconductor memory circuit capable of effectively suppressing write errors while also preventing an increase in the time taken to perform a data write to a memory cell.

In order to achieve the above described object, a semiconductor storage device of the present invention comprises a plurality of select lines and bit lines arranged alternately, a plurality of word lines arranged substantially orthogonal to the select lines and bit lines, a plurality of MOS transistors, having first electrodes connected to the select lines, second electrodes connected to the bit lines and control electrodes connected to the word lines, forming a plurality of memory cells, a first voltage supply circuit connected to the select lines for supplying a first voltage to the first electrodes, and a second voltage supply circuit connected to the bit lines and the select lines for supplying a second voltage, varying in compliance with variation in the first voltage, to the second electrodes.

DETAILED DESCRIPTION OF THE INVENTION

Embodiments of the present invention will now be described with reference to the drawings.

Figure 1:
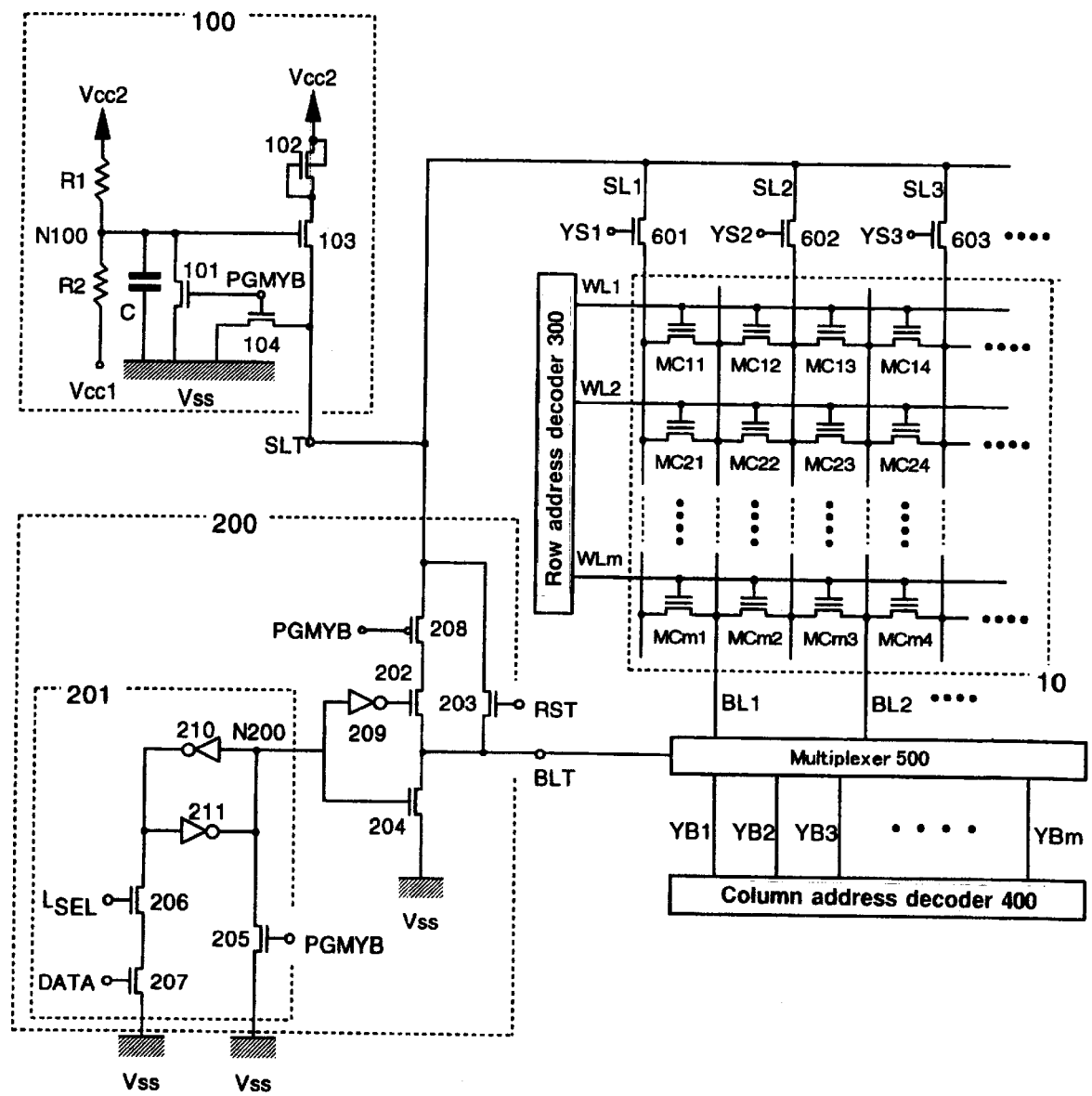
FIG. 1 is circuit diagram of a semiconductor memory circuit of a first embodiment of the present invention.

FIG. 1 is a drawing showing the structure of the semiconductor memory circuit of the first embodiment of the present invention. The ROM circuit shown in FIG. 1 is mainly made up of a memory cell array 10 having memory cells MCmn (m, n=1, 2, . . . ) for storing data arranged in a matrix, a plurality of word lines WL1–WLm connected to each memory cell MCmn, select lines SL1, SL2, . . . and bit lines BL1, BL2, . . . arranged substantially orthogonal to each of the word lines WL1–WLm and connected to each of the memory cells MCmn, a row address decoder 300 for selecting one of the plurality of word lines WL1–WLm, a column address decoder 400 for outputting bit line selection signals YB1, YB2, . . . , using the bit line selection signals YB1, YB2, . . . , a write circuit 200 as a second voltage supply circuit connected to the multiplexor 500, and a drain voltage supply circuit 100 as a first voltage supply circuit connected to the plurality of select lines SL1, SL2,.

First of all, Each element of the ROM circuit of the first embodiment of the present invention described above will be described concretely. The plurality of memory cells Cmn arranged in a matrix format constituting the memory cell array 10 comprise MOS transistors respectively having a floating gate electrode, and respective control gate electrodes are connected to word lines WL1–WLm. Also, among the plurality of word lines WL1 to WLm, a single word line is selected by a row address decoder 300 made up of NAND gates and inverters. The row address decoder 300 is controlled by a first program signal PGMYB and a second program signal GMXB exhibiting almost the same operating waveform. Drain electrodes of each MOS transistor are connected to a single select line among the plurality of select lines SL1, SL2, . . . , while the source electrodes of the MOS transistors are connected to a single bit line among the plurality of bit lines BL1, BL2, . . . . With such a plurality of memory cells MCmn, when data of "0" is written specifically, when electrons are injected into the floating gate electrode, for example, a voltage of 4.5 V is supplied to the drain electrode and a voltage of 0 V is supplied to the source electrode, to set a potential difference of 4.5 V across the drain electrode and source electrode. On the other hand, when data of "1" is written, that is, when electrons are removed from the floating gate electrode, a voltage of, for example, 4.5 V is supplied to the drain electrode and a voltage of 3V is supplied to the source electrode to set a potential difference of 1.5 V across the drain electrode and the source electrode. If the potential difference across the drain electrode and source electrode is 1.5 V or less, data of "1" is written into the memory cell. Select line selection transistors 601, 602, . . . are connected to select lines SL1, SL2, under the control of respective select line selection signals YS1, YS2, . . . . These select line selection transistors 601, 602, . . . are comprised of N-channel MOS transistors (hereafter referred to as NMOS transistors). A drain voltage supply circuit 100 as a first voltage supply circuit is connect to al of he select lines SL1, SL2, . . . , through the select line selection transistors 601, 602, . . . .

The drain voltage supply circuit 100 comprises, for example, resistors R1 and R2 connected in series between a second source potential Vcc2 (for example, 8V) and a first source potential Vcc1 (for example, 4V), a capacitor C and an NMOS transistor 101 connected between a node FN100 between the resistors R1 and R2 and a ground potential Vss, NMOS transistors 102 and 103 connected in series between the second source potential Vcc2 and an output terminal SLT of the drain voltage supply circuit 100, and an NMOS transistor 104 connected between the output terminal SLT and the ground potential Vss.

The NMOS transistors 101 and 104 are controlled together by a first program signal PGMYB input to gate electrodes of the transistors. A substrate potential of the NMOS transistor 102 is the first source potential Vcc1, which means that the NMOS transistor 102 has the same function as that of a diode. The NMOS transistor 103 has a gate electrode connected to the NMOS transistor 101, and a source electrode connected to the output terminal SLT of the drain voltage supply circuit 100. Also, in order to improve the drive capability of the drain voltage supply circuit 100, the size of the NMOS transistor 103 is made larger than the other NMOS transistors 101 and 102. With the drain voltage supply circuit 100 having this type of structure, when the first program signal PGMYB is at an "L" level the NMOS transistors 101 and 104 are in a non-conductive state, and so the voltage appearing on the node FN 100 is applied to the gate electrode of NMOS transistor 103 and a desired output voltage (for example, 4.5 V) appears on the output terminal SLT. On the other hand, when the first program signal PGMYB is at an "H" level, the NMOS transistors 101 and 104 are in a conducting state, and so the potential of the node FN100 is the ground potential Vss and a voltage of 0 V is output to the output terminal SLT.

Among the bit lines BL1, BL2, . . . connected to each of the source electrodes of the plurality of memory cells MCmn, a single bit line is selected by the multiplexer 500 using the bit line selection signals YB1, YB2, . . . output from the row address decoder 400. A desired voltage is supplied to a single selected bit line by a right circuit 200 as a second voltage supply circuit.

The structure of the write circuit 200, being the second voltage supply circuit, will now be described. A latch circuit 201 is included inside this write circuit 200, and the structure of this latch circuit 201 will first be described. This latch circuit 201 comprises inverters 210 and 211 each having the output terminal connected to the input terminal of the other, NMOS transistors 206 and 207 connected in series between the input terminal of the inverter 211 (the output terminal of the inverter 210) and a ground potential Vss, and an NMOS transistor 205 connected between the input terminal of the inverter 210 (the output terminal of the inverter 211) and the ground potential Vss. The first program signal PGMYB is input to the gate electrode of the NMOS transistor 205, and the first program signal PGMYB becomes an "L" level and so the NMOS transistor 205 is put in a non-conductive state. The NMOS transistor 206 is switch means for selecting the latch circuit 201, a latch circuit select signal LSEL is input to the gate electrode of the NMOS transistor 206 and when the latch circuit is selected the latch circuit select signal $L_{SEL}$ becomes an "H" level. A data is input to gate electrode of the NMOS transistor 207. This data signal DATA is an "L" level when writing data "1" into the memory cell MCmn, and an H2H level when writing data "0". Data latched in the latch circuit 201 appears at a node N200 which is the output terminal of the latch circuit 201.

Next, the circuit structure inside the write circuit 200 other than the latch circuit 201 will be described. Node 200 is connected to the gate electrode of the NMOS transistor 204, and to the gate electrode of the NMOS transistor 202 through an inverter 209. The source electrode of the NMOS transistor 202 and the drain electrode of the NMOS transistor 204 are connected together and to the output terminal BLT of the write circuit 200. A P-channel MOS transistor (hereafter referred to as a PMOS transistor) controlled by the first program to signal PGMYB is connected between the drain electrode of the NMOS transistor 202 and the output terminal SLT of the drain voltage supply circuit 100. Also, an NMOS transistor 203 controlled by a reset signal RST is connected between the drain electrode of the NMOS transistor 204 (output terminal SLT of the write circuit 200) and the output terminal SLT of the drain voltage supply circuit 100. This reset signal RST is a signal that becomes an "H" level for a fixed period immediately after the first program signal PGMYB has changed from an "L" level to an "H" level. A period for which the rest signal is at an "H" level is set to a period sufficient for the bit line potential to fall to the ground potential Vss after writing of data "1" to the memory cell MCmn has been completed.

Figure 2:
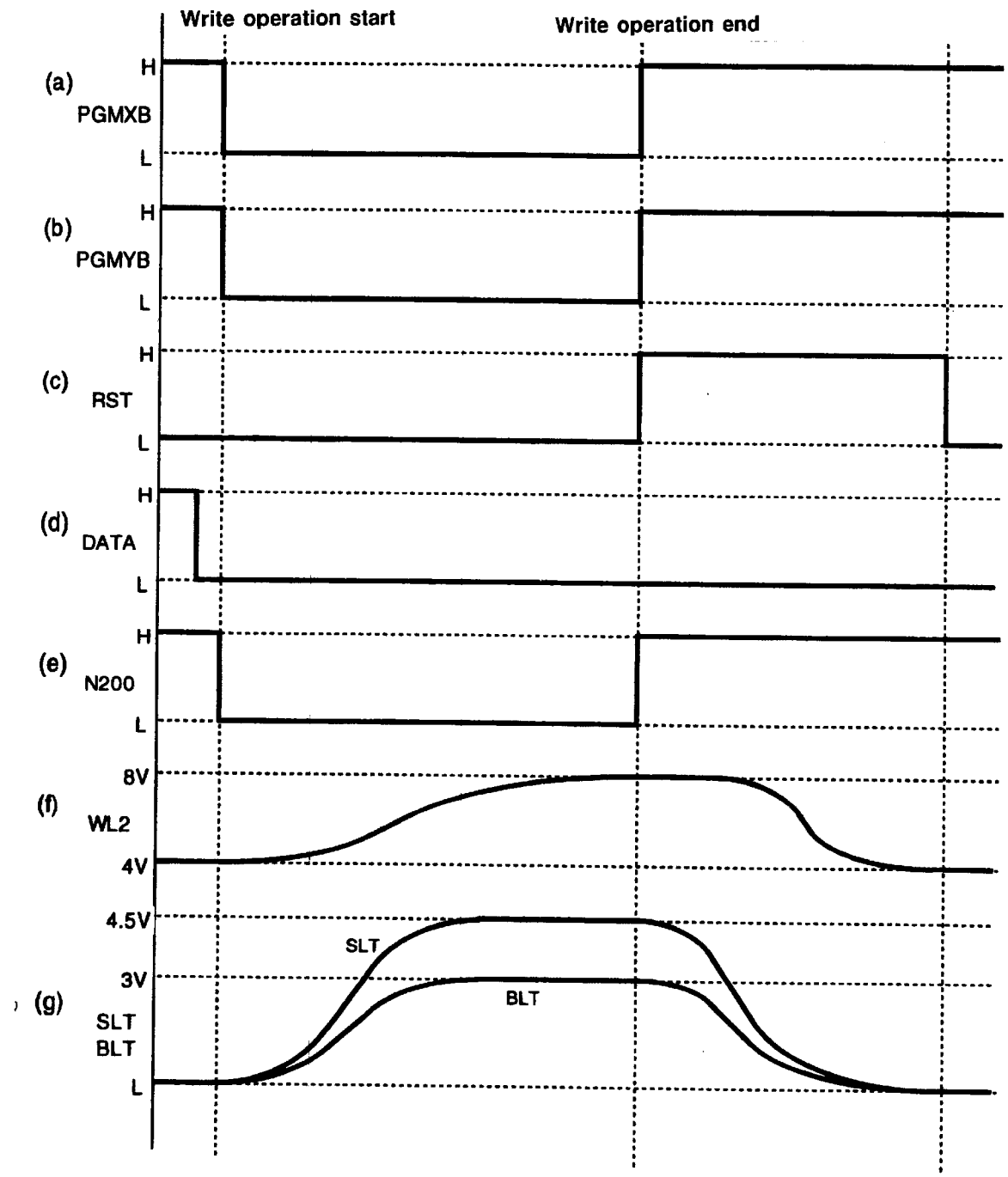
FIG. 2 is a timing chart relating to the semiconductor storage device of the first embodiment the present invention.

With reference to FIG. 2, a description will now be given of the operation of a ROM circuit of a first embodiment of the present invention having the above structure, in the case where data "1" is written into a memory cell.

FIG. 2 is an operation timing chart for the ROM circuit shown in FIG. 1. Here, a description is given of an example of writing data "1" to a memory cell MC22. Before commencing the operation of writing data "1" to the memory cell MC22, first and second program signals PGMYB and PGMXB are both set to an "H" level, as shown I FIG. 2(a) and FIG. 2(b). At this time, none of the word lines WL1"WLm are in a selected state, which means that they are all at an "L" level (4 V in this case). Also, in the drain voltage supply circuit 100 the NMOS transistor 101 is in a conducting state because the first program signal PGMYB is at an "H" level. As a result, the voltage at the node N100 is the ground potential Vss, and so the NMOS transistor 103 is in a non-conducting state. Also, since at that time the NMOS transistor 104 is in a conducting state because the first program signal PGMYB is at an "H" level, the potential of the output terminal SLT of the drain voltage supply circuit 100 is the ground potential Vss.

On the other hand, in the write circuit 200, since the first program signal PGMYB is at the "H" level, the NMOS transistor 205 is in a conducting state, and the node N200 becomes the ground potential Vss (refer to FIG. 2(e)). That is, the potential of the gate electrode of the NMOS transistor 204 is at an "L" level, and the NMOS transistor 204 is in a non-conducting a state. An "H" level is also input to the gate electrode of the PMOS transistor 208, and the PMOS transistor 208 is also in a non-conducting state. Accordingly, an output potential does not appear on the output terminal BLT of the write circuit 200.

After that, as shown in FIG. 2(a) and FIG. 2(b), the first and second program signals PGMYB and PGMXB change from an "H" level to an "L" level, and an operation of writing a data "1" into the memory cell MC22 commences. Operation of the ROM circuit in this case will now be described.

First of all, if the second program signal PGMXB changes from an "H" level to an "L" level, then as shown in FIG. 2(f), the potential of a word line WL2, among the plurality of word lines WL1–WLm, connected to a control gate electrode of the memory cell MC22 is raised from an "L" level (4V) to an "H" level (8V) by the row address decoder 300. Also, with respect to the select line SL2 connected to the drain electrode of the memory cell MC22, an "H" level select line selection signal YS2 is input to the gate electrode of the select line selection transistor 602, and the select line selection transistor 602 is put into a conducting state. That is, the output terminal SLT of the drain voltage supply circuit 100 and the drain electrode of the memory cell MC22 are put into a state where they can be electrically connected.

Also, if the first program signal PGMYB changes from an "H" level to an "L" level, then in the drain voltage supply circuit 100 the NMOS transistors 101 and 104 are put into a non-conducting state, and a voltage divided by the resistore R1 and R2 and appearing on the node N100 is applied to the gate electrode of the NMOS transistor 103. Thus, the NMOS transistor 103 is in a conducting state, and the potential at the output terminal SLT of the drain voltage supply circuit 100 starts to rise. As a result, as shown in FIG. 2(g), the potential on the select line SL2, that is, the potential of the drain electrode of the memory cell MC22 to which data "1" is to be written, starts to be raised towards 4.5V.

On the other hand, the bit line BL1 connected to the source electrode of the memory cell MC22 is selected by the bit line selection signal YB1 output from the row address decoder being input to the multiplexer 500. That is, the output terminal BLT of the write circuit 200 and the source electrode of the memory cell MC22 are put into a state where they can be electrically connected.

Operation of the write circuit 200 will now be described. When the write operation commences, as shown in FIG. 2(b) and FIG. 2(c), the first program signal PGMYB and the reset signal RST are at an "L" level, which means that the NMOS transistor 203 and the NMOS transistor 205 are in a non-conductive state, while the PMOS transistor 208 is in a conducting state. Also at this time, as shown in FIG. 2(d), since the data signal DATA is at an "L" level, the NMOS transistor 207 is also in a non-conducting state. Accordingly, the potential of the output terminal of the inverter 210 and the input terminal of the inverter 211 in the latch circuit 201 is an "H" level, while the potential of the input terminal of the inverter 210 and the output terminal of the inverter 211, namely the potential of the node N200, is an "L" level (refer to FIG. 2(e). When the potential on the node N200 is an "L" level, the NMOS transistor 204 is put into a non-conducting state, while on the other hand, since the output potential of the inverter 209 is an "H" level the NMOS transistor 202 is in a conducting state. Specifically, the output terminal BLT of the write circuit 200 is put into a state where it can be electrically connected with the output terminal SLT of the drain voltage supply circuit 100 through the PMOS transistor 208 and the NMOS transistor 202. Accordingly, as shown in FIG. 2(g), if the potential of the select line SL2, that is, the potential of the output terminal SLT of the drain voltage supply circuit 100, rises, the potential of the output terminal BLT of the write circuit 200 also rises following change in the potential of the output terminal SLT. At this time, the output terminal BLT of the write circuit 200 rises towards a value of a threshold potential of the PMOS transistor 208 and the NMOS transistor 202 subtracted from the output potential of the output terminal SLT of the drain voltage supply circuit 100, for example, 3V. Specifically, the potential of the source electrode of the memory cell MC22 begins to rise towards 3V.

As described above, if the first program signal PGMYB changes from an "H" level to an "L" level, the word line WL2 begins to rise towards 8V, as shown in FIG. 2(g), the potential of the select line SL1 (the drain electrode of the memory cell MC22) begins to rise towards 4.5 V, and the potential of the bit line BL1 (the source electrode of the memory cell MC22) begins to rise towards 3V, and the operation of writing data "1" to the memory cell MC22 commences. At this time, as has been described above, the potential of the source electrode (the bit line BL1) of the memory cell MC2 is rising while following the potential of the drain electrode (select line SL2), which means that as shown in FIG. 2(g) during the operation of writing data "1" to the memory cell MC22 it is possible to suppress the potential of the source electrode of the memory cell MC22 becoming larger than the potential of the drain electrode of the memory cell MC22, with the difference between the two potentials being too large. As a result, it is possible to effectively suppress a write error during the operation of writing data "1" to the memory cell MC22, while preventing any increase in the time required for the write operation to the memory cell MC22.

Next, operation of the ROM circuit will be described for the case where the first and second program signals PGMYB and PGMXB change from an "L" level to an "H" level, as shown in FIG. 2(a) and FIG. 2(b), and the operation of writing data "1" to the memory cell MC2 is completed.

First, if the second program signal PGMXB changes from an "L" level to an "H" level, then as shown in FIG. 2(f), the potential of the word line WL2 starts to lower from an "H" level (8V) to an "L" level (4V). On the other hand, the operation of the drain voltage supply circuit 100 and the write circuit 200 when the first program signal PGMYB has changed from an "L" level to an "H" level will be described below.

FIRST in the drain voltage supply circuit 100, the NMOS transistor 101 is put into a conducting state by the "H" level first program signal PGMYB, and the potential of the gate electrode of the NMOS transistor 103 is set to the ground potential Vss. Accordingly, the NMOS transistor 103 is put in a non-conducting state. If the first program signal PGMYB is set to an "H" level, the NMOS transistor 104 is put into a conducting state, so as shown. in FIG. 2(g), the potential of the output terminal SLT of the drain voltage supply circuit 100 that has outputted a voltage of 4.5V begins to fall to 0V (ground potential Vss), that is in the direction of an "L" level.

On the other hand, in the write circuit 200, the PMOS transistor 208 is put in to a nonconducting state and the NMOS transistor 205 of the latch circuit 201 is put into a conducting state by the "H" level first program signal PGMYB. As a result, the potential on node N200, being the output terminal of the latch circuit 201, becomes an "L" level as shown in FIG. 2(e), and the NMOS transistor 204 is put into a non-conducting state. Also, #V immediately after the first program signal PGMYB changes from an "L" level to an "H" level, as shown in FIG. 2(c), the reset signal RST changes from an "L" level to an "H" level, which means that the NMOS transistor 203 is put in a conducting state. That is, the output terminal BLT of the write circuit 200 is put in a state where it can be electrically connected to the output terminal SLT of the drain voltage supply circuit 100 through the NMOS transistor 203. As a result, if the potential of the output terminal SLT of the drain voltage supply circuit 100 (the drain electrode of the memory cell MC22) begins to fall in the direction of an "L" level, as described above, then following this fall the output terminal BLT of the write circuit 200 (the source electrode of the memory cell MC22) also begins to fall in the direction of an "L" level through the NMOS transistor 103, as shown in FIG. 2(g). Accordingly, when the operation of writing data "1" into the memory cell MC22 has completed, it is possible to suppress the potential of the source electrode of the memory cell MC22 from becoming larger than the potential on the drain electrode of the memory cell MC22, and a potential difference between the two becoming too large. Specifically, after completing the operation of writing data "1" into the memory cell MC22, it is possible to effectively suppress data write errors when switching to a verify operation for confirming whether or not the correct data has been written into the memory cell MC22.

As has been described above, according to the semiconductor memory circuit of the first embodiment of the present invention, supply of a voltage to the word line connected to the memory cell to which data is to be written is commenced together with electrical connection of the output terminal SLT of the drain voltage supply circuit 100 to the output terminal BLT of the write circuit 200, through either the PMOS transistor 208 and the NMOS transistor 202, or through the NMOS transistor 203, which means that a voltage supplied to the source electrode of the MOS transistor constituting the memory cell of the ROM circuit can be made to change in line with a voltage supplied to the drain electrode of that MOS transistor. As a result, with respect to the write operation to the memory cell, it is possible to effectively suppress data write errors to the memory cell due to the voltage supplied to the source electrode of the memory cell becoming larger than the voltage supplied to the drain electrode of the memory cell, or the difference between the two potentials becoming too large, while suppressing any increase in the time required for the data write.

Figure 3:
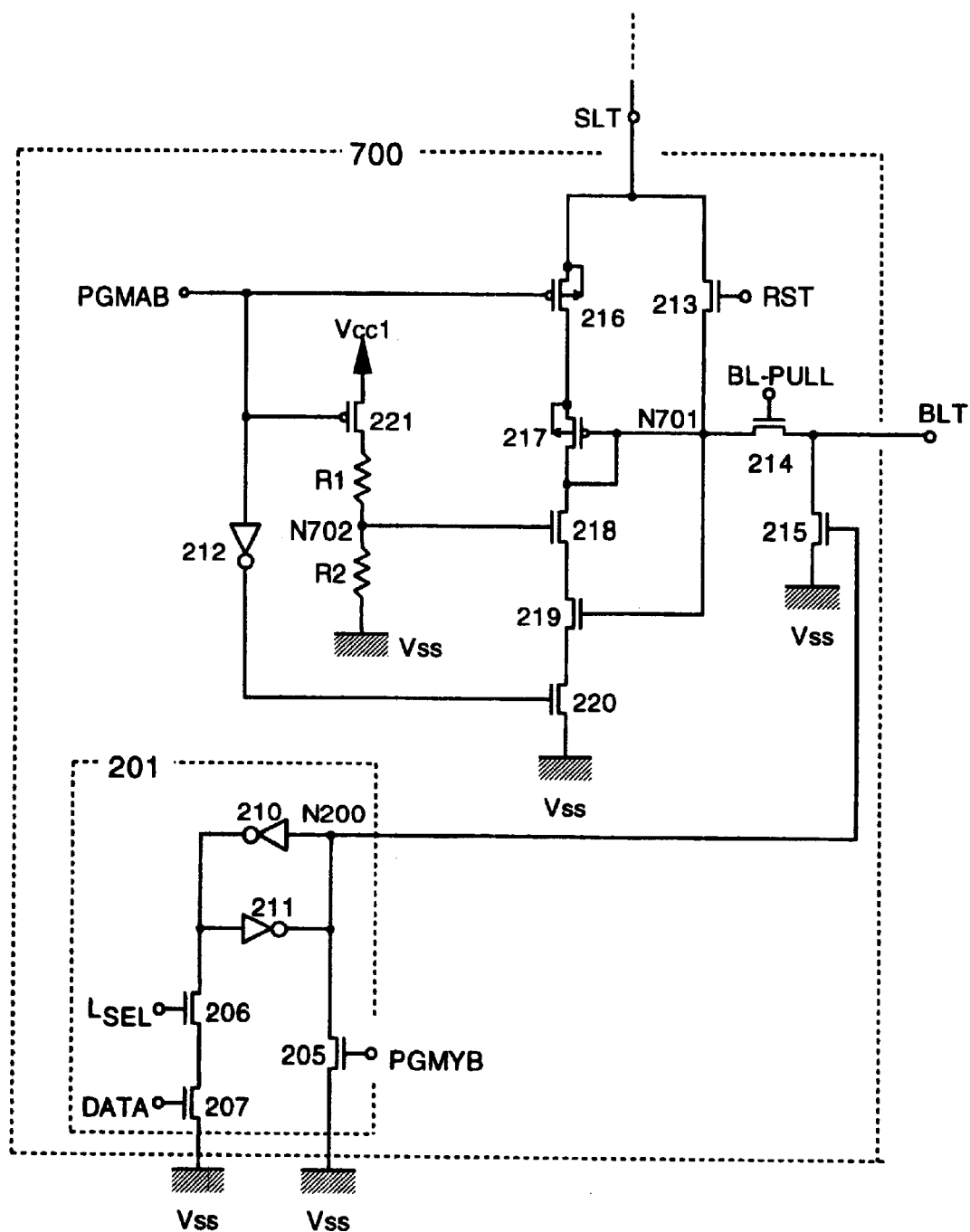
FIG. 3 is a circuit diagram of a semiconductor memory circuit of a second embodiment of the present invention.

A semiconductor memory circuit of a second embodiment of the present invention will now be described. FIG. 3 is a drawing showing the structure of a write circuit 70 of the semiconductor memory circuit of the second invention. Apart from the circuit structure of the write circuit 700, the circuit structure of the semiconductor memory circuit of the second embodiment is the same as the circuit structure of the semiconductor memory circuit of the first embodiment, and so description will mainly be given here of the structure and operation of the write circuit 700.

First of all, the structure of the write circuit 700 of the second embodiment will be described. A latch circuit 201 is included in this write circuit 700 the same as in the case of the first embodiment, and the structure of this latch circuit is the same as the structure of the latch circuit 201 of the first embodiment, so description of the structure of the latch circuit 201 will be omitted here, and description will be given of the circuit structure other than the latch circuit 201.

Node N200, which is the output terminal of the latch circuit 201, is connected to the gate electrode of NMOS transistor 215 connected between the output terminal BLT of the write circuit 700 and ground potential Vss. An NMOS transistor 214 controlled by a bit line pull-up signal BL-PULL is connected between node N701 and the output terminal BLT of the write circuit 700. This bit line pull-up signal BL-PULL is an "H" level when the data signal DATA is an "L" level and a third program signal PGMAB is an "L" level, and is a signal for putting the NMOS transistor 214 into a conducting state. An NMOS transistor 213 controlled by a reset signal RST is connected between the node N701 and the output terminal SLT of the drain voltage supply circuit 100. This reset signal RST is the same as for the case of the first embodiment, and becomes an "H" level for a specified period immediately after the first program signal PGMYB has changed from an "L" level to an "H" level, with the period for which the reset signal is at an "H" level being set to a period sufficient for the potential on the bit line to fall to the ground potential Vss after completion of the write of data "1" to the memory cell MCmn.

Also, PMOS transistors 216 and 217m and NMOS transistors 218–220 are connected in series between the output terminal SLT of the drain voltage supply circuit 100 and the ground potential Vss. The third program signal PGMAB is input to the gate electrode of the PMOS transistor 216, and the substrate of the PMOS transistor 216 is connected to the output terminal SLT of the drain voltage supply circuit 100. As shown in FIG. 4(f), this third program signal PGMAB is an "L" level signal when the first program signal PGMYB is at an "L" level or the reset signal RST is at an "H" level. The gate electrode of the PMOS transistor 217 is connected to node N701 and its own drain electrode, and the substrate of the PMOS transistor 217 is connected to its own source electrode. A voltage divided by resistors R3 and R4 connected in series between a source potential Vcc1 (for example 4V) and the ground potential Vss is applied to the gate electrode of the NMOS transistor 218. A gate electrode of the NMOS transistor 219 is connected to the node N701. The third program 25 signal PGMAB is input to the gate electrode of the NMOS transistor 220 through the inverter 212. A PMOS transistor 221 is connected between the resistor R3 and source potential Vcc, and the third program signal PGMAB is input to the gate electrode of the PMOS transistor 221.

Next, a description will be given, with reference to FIG. 4, mainly of the operation of the write circuit 700, in the case of writing data "1" to the memory cell MC22, for example, in the ROM circuit of the second embodiment of the present invention having the above described write circuit.

Figure 4:
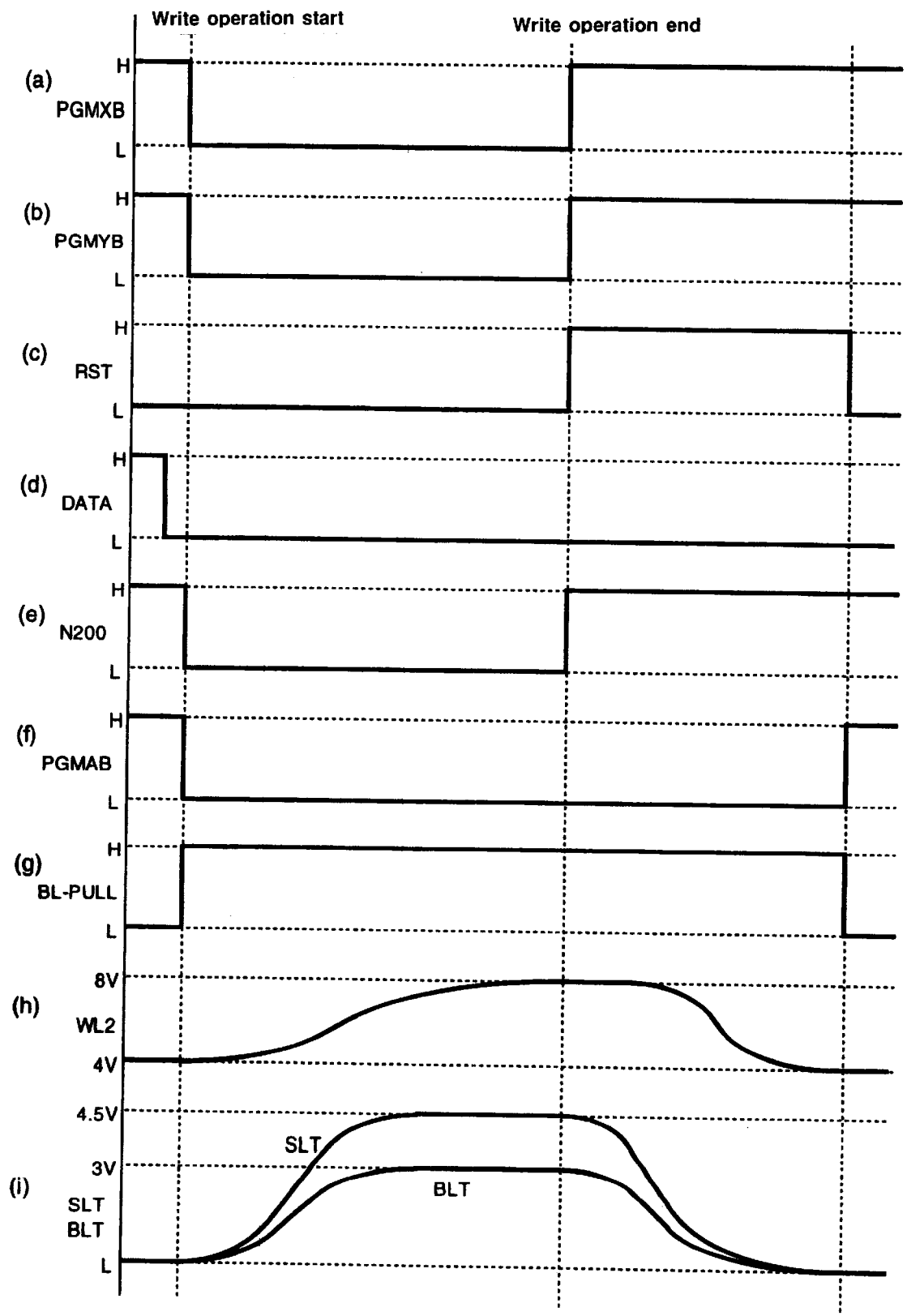
FIG. 4 is a timing chart relating to the semiconductor storage device of the second embodiment of the present invention.

FIG. 4 is an operation timing chart for the ROM circuit shown in FIG. 3. Before commencing the operation of writing data "1" into the memory cell MC22, as shown in FIG. 4(a) and FIG. 4(b), first and second program signals PGMYB and PGMXB are both at "H" levels, and, as with the first embodiment, in a state where no word line WL1–WLm is selected and no output potential appears on the output terminal SLT of the drain voltage supply circuit 100. Also, in the write circuit 700, as shown in FIG. 4(g), the bit line pull-up signal BL-PULL is at an "L" level which means that the NMOS transistor 214 is in a non-conducting state. Since the first program signal PGMYB is at an "H" level, the NMOS transistor 205 is in a non-conducting state, and it therefore follows that the node N200 is at an "L" level, and so the NMOS transistor 215 is also in a non-conducting state. Accordingly, no output potential appears on the output terminal BLT of the write circuit 700.

Next, a description will be given of the operation of the ROM circuit in the case where, as shown in FIG. 4(a) and FIG. 4(b), the first and second program signals PGMYB and PGMXB change from an "H" level to an "L" level, and the operation of writing data "1" into the memory cell MC22 is commenced.

First of all, if the second program signal PGMXB changes from an "H" level to an "L" level, then as shown in FIG. 4(h), and the same as in the first embodiment, the potential of the word line WL2 connected to the control gate electrode of the memory cell MC22 is raised from an "L" level (4V) to an "H" level (8V), and the select line selection transistor 602 of the select line SL2 connected to the rain electrode of the memory cell MC22 is put into a conducting state. Here, since the first program signal PGMYB also changes from an "H" level to an "L" level, the same as in the first embodiment, as shown in FIG. 2(i) the potential of the select line SL2, that is the potential of the drain electrode of the memory cell MC22 to which data "1" is to be written, begins to rise towards 4.5V.

On the other hand, the bit line BL1 connected to the source electrode of the memory cell 22 is selected by the bit line selection signal YB1 output from the row address decoder 400 being input to the multiplexer 500. That is, the output terminal BLT of the write circuit 700 and the source electrode of the memory cell MC22 are put into a state where they can be electrically connected.

Description will now be given of the operation of the write circuit 700. When commencing the write operation, as shown in FIG. 4(b), if the first program signal PGMYB becomes an "L" level, the NMOS transistor 205 is put in a non-conducting state. Also, at this time, as shown in FIG. 4(d), since the data signal DATA is at an "L" level, the NMOS transistor 207 is also in a non-conducting state. Accordingly, the potential of the output terminal of the inverter 210 and the input terminal of the inverter 210 in the latch circuit 201 is set to an "H" level, and the potential of the input terminal of the inverter 210 and the output terminal of the inverter 211, namely the potential of the node N200, is set to an "L" level, as shown in FIG. 4(e). When the potential of node N200 is an "L" level, the NMOS transistor 215 is put in a non-conducting state.

Also at this time, as shown in FIG. 4(c) and FIG. 4(f), since the reset signal RST and the third program signal PGMAB are both at "L" levels, the NMOS transistor 213 is in a non-conducting state, while the PMOS transistors 216 and 221 are in a conducting state. If the PMOS transistor 216 and the NMOS transistor 220 are in a conducting state, a voltage obtained by subtracting a threshold voltage of the PMOS transistor 216 from an output voltage of the output terminal SLT of the drain voltage supply circuit 100 is applied to the source electrode of the PMOS transistor 217, while on the other hand the potential of the source electrode of the NMOS transistor 219 is set to the ground potential Vss. Also, if the PMOS transistor 221 is in a conducting state, the voltage divided by the resistors R3 and R4 appears on node N702, and this voltage is applied to the gate electrode of the NMOS transistor 218.

As a result, the PMOS transistor 217 and the NMOS transistors 218 and 219 are put into a conducting state, and a desired voltage, namely a voltage required to write data "1" into the memory cell MC22 (for example 3V), appears on the node 701. This voltage is less than or equal to a voltage obtained by subtracting the threshold voltage of the PMOS transistor 217 from the output voltage on the output terminal SLT of the drain voltage supply circuit 100, and is also a voltage controlled by NMOS transistors 218–220 and resistors R1 and R2. Therefore, as described previously, when writing data "1" into the memory cell MC22, since the data signal DATA is at an "L" level and the third program signal PGMAB is at an "L" level, the bit line pull-up signal BL-PULL becomes an "H" level and the NMOS transistor 214 is put into a conducting state. As a result of that, as described previously, a voltage (3V) required to write data "1" into the memory cell MC22 appears on the output terminal BLT of the write circuit 700. Specifically, as shown in FIG. 4(i), if the potential of the bit line SL2, namely the potential on the output terminal SLT of the drain voltage supply circuit 100, rises, the potential on the output terminal BLT of the write circuit 700 also rises, following variation in the potential on the output terminal SLT. Accordingly, the potential on the source electrode of the memory cell MC22 begins to rise towards 3V.

As described above, if the first program signal PGMYB changes from an "H" level to an "L" level, then the word line WL2 begins to rise towards 8V, as shown in FIG. 4(h), the select line SL2 (drain electrode of the memory cell MC22) begins to rise towards 4.5V, as shown in FIG. 4(i), the bit line BL2 (source electrode of the memory cell MC22)

begins to rise towards 3V, as also shown in FIG. 4(*i*), and the operation of writing data "1" into the memory cell MC22 commences. At this time, as described above, the potential on the source electrode of the memory cell MC22 (bit line BL2) rises while following the potential on the drain electrode (select line SL2), and so, as shown in FIG. 2(*i*), during the operation of writing data "1" into the memory cell MC22 it is possible to suppress the potential of the source electrode of the memory cell MC22 from becoming larger than the potential of the drain electrode of the memory cell MC22, and the difference between the two potentials being too large. As a result, it is possible to effectively suppress a write error during the operation of writing data "1" to the memory cell MC22, while preventing any increase in the time required for the write operation to the memory cell MC22.

Next, operation of the ROM circuit will be described for the case where the first and second program signals PGMYB and PGMXB change from an "L" level to an "H" level, as shown in FIG. 4(*a*) and FIG. 4(*b*), and the operation of writing data "1" to the memory cell MC22 is completed.

First, if the second program signal PGMXB changes from an "L" level, then as shown in FIG. 2(*h*), the potential of the word line WL2 starts to lower from an "H" level (8V) to an "L" level (4V). On the other hand, the operation of the drain voltage supply circuit 100 and the write circuit 700 when the first program signal PGMYB has changed from an "L" level to an "H" level will be described below.

In the drain voltage supply circuit 100, the NMOS transistor 101 is put into a conducting state by the "H" level first program signal PGMYB. Accompanying this, the potential of the gate electrode of the NMOS transistor 103 is set to the ground potential Vss, and the NMOS transistor 103 is put in a non-conducting state. Also at this time, since the first program signal PGMYB is set to an "H". level, the NMOS transistor 104 is put into a conducting state, so as shown in FIG. 2(*i*), the potential of the output terminal SLT of the drain voltage supply circuit 100 that has outputted a voltage of 4.5V begins to fall to 0V (ground potential Vss), an that is in the direction of an "L" level (0V).

On the other hand, in the write circuit 700, the NMOS transistor 205 of the latch circuit 201 is put into a conducting state by the "H" level first program signal PGMYB, and the potential on node N200, being the output terminal of the latch circuit 201, becomes an "L" level, but as a result, the NMOS transistor 205 is put in a non-conducting state and so the output terminal BLT of the write circuit write circuit 700 does not become the ground potential Vss through the NMOS transistor 215. However, at this time, as shown in FIG. 4(*c*), since the reset signal RST is at an "H" level, the NMOS transistor 213 is in a conducting state. Also, since as shown in FIG. 4(*g*) the bit line pull-up signal BL-PULL is at an "H" level, the NMOS transistor 214 is in a conducting state. Specifically, the output terminal SLT of the drain voltage supply circuit 100 can be electrically connected to the output terminal BLT of the write circuit 700. As a result, if the potential of the output terminal SLT of the drain voltage supply circuit 100 (the drain electrode of the memory cell MC22) begins to fall in the direction of an "L" level, as described above, then following this fall the output terminal BLT of the write circuit 700 (the source electrode of the memory cell MC22) also begins to fall in the direction of an "L" level, as shown in FIG. 2(*i*).

Accordingly, after completion of the operation of writing data "1" into the memory cell MC22, it is possible to suppress the potential of the electrode of the memory cell MC22 becoming larger than the potential on the drain electrode of the memory cell MC22, and a potential difference between the two becoming too large. Specifically, after completing the operation of writing data "1" into the memory cell MC22, it is possible to effectively suppress data write errors when switching to a verify operation for confirming whether or not the correct data has been written into the memory cell MC22.

As has been described above, according to the semiconductor memory circuit of the second embodiment of the present invention, supply of a voltage to the word line connected to the memory cell to which data is to be written is commenced together with electrical connection of the output terminal slt of the drain voltage supply circuit 100 to the output terminal blt of the write circuit 700, through either the pmos transistors 216 and 217, or through the nmos transistor 213, which means that a voltage supplied to the source electrode of the mos transistor constituting the memory cell of the rom circuit can be made to change in line with a voltage supplied to the drain electrode of that mos transistor. as a result, with respect to the write operation to the memory cell, it is possible to effectively suppress data write errors to the memory cell due to the voltage supplied to the source electrode of the memory cell becoming larger than the voltage supplied to the drain electrode of the memory cell, or the difference between the two potentials becoming to large, while suppressing any increase in the time required for the data write.

What is claimed is:

1. A semiconductor storage device, comprising:
   a plurality of alternately arranged select lines and bit lines;
   a plurality of word lines arranged substantially orthogonal to the select lines and bit lines;
   a plurality of MOS transistors which forms a plurality of memory cells, wherein the plurality of MOS transistors have first electrodes connected to the select lines, second electrodes connected with the bit lines and control electrodes connected to the word lines;
   a first voltage supply circuit connected with the select lines to supply a first voltage to the first electrodes; and
   a second voltage supply circuit connected with the bit lines and the select lines to supply a second voltage to the second electrodes, wherein the second voltage varies in compliance with a variation in the first voltage.

2. The semiconductor memory circuit of claim 1, wherein the first voltage supply circuit is connected to the second voltage supply circuit through a first MOS transistor.

3. The semiconductor memory circuit of claim 1, wherein the first voltage is higher than the second voltage.

4. The semiconductor memory circuit of claim 2, further comprising:
   a second MOS transistor, between the first voltage supply circuit and the second voltage supply circuit, connected in parallel with the first MOS transistor.

5. The semiconductor memory circuit of claim 4, wherein the first MOS transistor is in a conducting state during a data write operation to the memory cells, and
   the second MOS transistor is in a conducting state after completion of the data write operation to the memory cells.

6. The semiconductor memory circuit of claim 4, wherein the first MOS transistor is put into a conducting state when the potential on the first and second electrodes is caused to rise, and the second MOS transistor is put in a conducting state when the potential on the first and second electrodes is caused to fall.

7. A semiconductor storage device, comprising:

a plurality of alternately arranged select lines and bit lines;

a plurality of word lines arranged substantially orthogonal to the select lines and bit lines;

a plurality of MOS transistors which forms a plurality of memory cells, wherein the plurality of MOS transistors have first electrodes connected to the select lines, second electrodes connected with the bit lines and control electrodes connected to the word lines;

a first voltage supply circuit connected with the select lines to supply a first voltage to the first electrodes; and a second voltage supply circuit coupled between the bit lines and an output terminal of the first to supply a second voltage to the second electrodes, wherein the second voltage is based on the first voltage.

8. The semiconductor memory circuit of claim 7, wherein the first voltage supply circuit is connected to the second voltage supply circuit through a first MOS transistor.

9. The semiconductor memory circuit of claim 7, wherein the first voltage is higher than the second voltage.

10. The semiconductor memory circuit of claim 8, further comprising:

a second MOS transistor, between the first voltage supply circuit and the second voltage supply circuit, connected in parallel with the first MOS transistor.

11. The semiconductor memory circuit of claim 10, wherein the first MOS transistor is in a conducting state during a data write operation to the memory cells, and the second MOS transistor is in a conducting state after completion of the data write operation to the memory cells.

12. The semiconductor memory circuit of claim 10, wherein the first MOS transistor is put into a conducting state when the potential on the first and second electrodes is caused to rise, and the second MOS transistor is put in a conducting state when the potential on the first and second electrodes is caused to fall.

* * * * *